United States Patent [19]
Schwarz

[11] Patent Number: 5,982,681
[45] Date of Patent: Nov. 9, 1999

[54] RECONFIGURABLE BUILT-IN SELF TEST CIRCUIT

[75] Inventor: William Schwarz, San Leandro, Calif.

[73] Assignee: LSI Logic Corporation, Milpitas, Calif.

[21] Appl. No.: 08/948,920

[22] Filed: Oct. 10, 1997

[51] Int. Cl.⁶ .................................................. G01R 31/28
[52] U.S. Cl. ........................ 365/201; 371/22.5; 371/25.1
[58] Field of Search ................... 371/23.1, 25.1, 371/22.5, 22.31; 395/183.06, 182.05; 365/201

[56] References Cited

U.S. PATENT DOCUMENTS

| | | | |
|---|---|---|---|
| 5,132,685 | 7/1992 | De Witt et al. | 341/120 |
| 5,173,906 | 12/1992 | Dreibelbis | 371/22.5 |
| 5,553,082 | 9/1996 | Connor et al. | 371/25.1 |
| 5,568,437 | 10/1996 | Jamal . | |
| 5,617,531 | 4/1997 | Crouch et al. | 395/183.06 |
| 5,764,878 | 6/1998 | Kablanian et al. | 395/182.05 |
| 5,812,562 | 9/1998 | Baeg | 371/22.31 |

Primary Examiner—Viet O. Nguyen
Attorney, Agent, or Firm—Conley, Rose & Tayon, PC; B. Noel Kivlin; Raiph Veseli

[57] ABSTRACT

A reconfigurable built-in self test circuit for enabling the debugging of an embedded device. In one embodiment, the write data path from the built-in self test module to the embedded device includes a multiplexer which is controlled by a debug signal. When the debug signal is de-asserted, the multiplexer forwards the write data from the built-in self test module to the embedded device, thereby allowing the self test to proceed in the hard wired manner. When the debug signal is asserted, the multiplexer forwards external data from the user to the embedded device, thereby allowing the user to execute customized tests on the embedded device. A second multiplexer is similarly placed in the expected data path from the built-in self test module to the comparator to allow the user to provide external data for comparison with output data from the embedded device when the debug signal is asserted. For all tests, the address and control data is provided by the built-in self test module to avoid the need to implement an external access to these data paths.

5 Claims, 2 Drawing Sheets

RECONFIGURABLE BUILT-IN SELF TEST CIRCUIT

BACKGROUND OF THE INVENTION

1. Field of the Invention

This invention relates to the field of built-in self test modules for integrated circuits, and more particularly, to a system and method for reconfiguring built-in self test modules to provide adjustable tests for integrated memories.

2. Description of the Related Art

It is common practice for the manufacturers of application specific integrated circuit (ASIC) chips to test the functionality of the ASIC chips at the manufacturing site. After the chips have been tested and certified for shipment, the users generally depend on the reliability of the chips for their own system design. As the density and complexity of ASIC chips increases, this reliability becomes more difficult to attain. Before the ASIC chips are released for shipment, they typically undergo testing to verify the functionality of the chip. This is necessary because it is not uncommon for a significant percentage of ASIC chips to fail due to manufacturing defects and degradation faults.

In the past, ASIC chips have been tested using external Automatic Test Equipment (ATE) at the manufacturing site. Since speed is an issue, and since it is often difficult to provide external access to certain chip functionality, an increasingly standard technique is the use of built-in self-test (BIST) circuitry. In this technique, additional hardware is added to a design so that testing is accomplished with a reduced need for external special purpose testing hardware. One popular example of BIST circuitry is the use of a pseudorandom vector generator and a data compactor. The generator produces the test vectors to be applied to a circuit under test and the compactor reduces the response to these vectors to a single value (e.g., 16 or 32 bits) known as the signature. It is then possible for the ATE to initialize or provide parameters to the generator and examine signatures from the compactor to verify the functionality of the chip.

Random Access Memory (RAM), Read-Only Memory (ROM), and multipliers are common test targets, but they may be deeply embedded within the IC logic making them difficult to access for test purposes. BIST circuitry may be fabricated on the integrated circuit itself to verify the functionality of these devices. The BIST logic generates input test patterns for the RAMs, ROMs, or multipliers and determines if the output data agrees with expected values. The output data from the sub circuits can either be compared with the expected data from the BIST directly or compacted in a signature register. The BIST logic typically generates a failure signal upon detecting a device fault.

While BIST circuitry can verify device functionality, it typically does not provide any assistance in determining the cause of any detected failure. While customizing the BIST circuitry to perform this function is certainly possible, it is expected that this would result in excessive cost and complexity being added to the integrated circuit. Nevertheless, it would be desirable to have a method for debugging embedded devices which leverages off of the existing BIST circuitry to minimize added cost and complexity.

SUMMARY OF THE INVENTION

The problems outlined above are in large part solved by a reconfigurable built-in self test circuit. In one embodiment, the write data path from the built-in self test module to the embedded device includes a multiplexer which is controlled by a debug signal. When the debug signal is de-asserted, the multiplexer forwards the write data from the built-in self test module to the embedded device, thereby allowing the self test to proceed in the hard wired manner. When the debug signal is asserted, the multiplexer forwards external data from the user to the embedded device, thereby allowing the user to execute customized tests on the embedded device. A second multiplexer is similarly placed in the expected data path from the built-in self test module to the comparator to allow the user to provide external data for comparison with output data from the embedded device when the debug signal is asserted. For all tests, the address and control data is provided by the built-in self test module to avoid the need to implement an external access to these data paths.

Broadly speaking, the present invention contemplates an integrated circuit which has a self test mode. The integrated circuit comprises an embedded memory, a built-in self test circuit, a comparator, and a first multiplexer. The embedded memory is configured to store input data in a location specified by an address signal when a write signal is asserted and is further configured to provide output data from a location specified by the address signal when a read signal is asserted. The built-in self test circuit is coupled to provide the address signal, the write signal, and the read signal to the embedded memory during the self test mode. The built-in self test circuit is also configured to generate BIST data patterns and BIST expected data during the self test mode. The comparator is coupled to receive the output data from the embedded memory and configured to compare the output data to compare data. The comparator is further coupled to provide comparison results to the built-in self test circuit. The first multiplexer is coupled to the built-in self test circuit to receive the BIST data patterns, coupled to the embedded memory to provide the input data, coupled to an external data buffer to receive external data, and configured to provide the BIST data patterns as the input data when a debug signal is de-asserted. The first multiplexer is also configured to provide the external data as the input data when the debug signal is asserted.

The present invention further contemplates a method for debugging a faulty embedded memory. The method comprises the steps of: (1) applying power to an integrated circuit which includes the embedded memory, thereby causing the integrated circuit to enter a self test mode in which a built-in self test circuit applies a sequence of read and write addresses to the embedded memory; (2) providing external data to a first multiplexer which is coupled to provide input data to the embedded memory; (3) asserting a debug signal to cause the first multiplexer to forward the external data to the embedded memory; and (4) monitoring a BIST status signal provided by the built-in self test circuit. The BIST status signal is indicative of detected memory faults.

BRIEF DESCRIPTION OF THE DRAWINGS

Other objects and advantages of the invention will become apparent upon reading the following detailed description and upon reference to the accompanying drawings in which.

Figure 1:
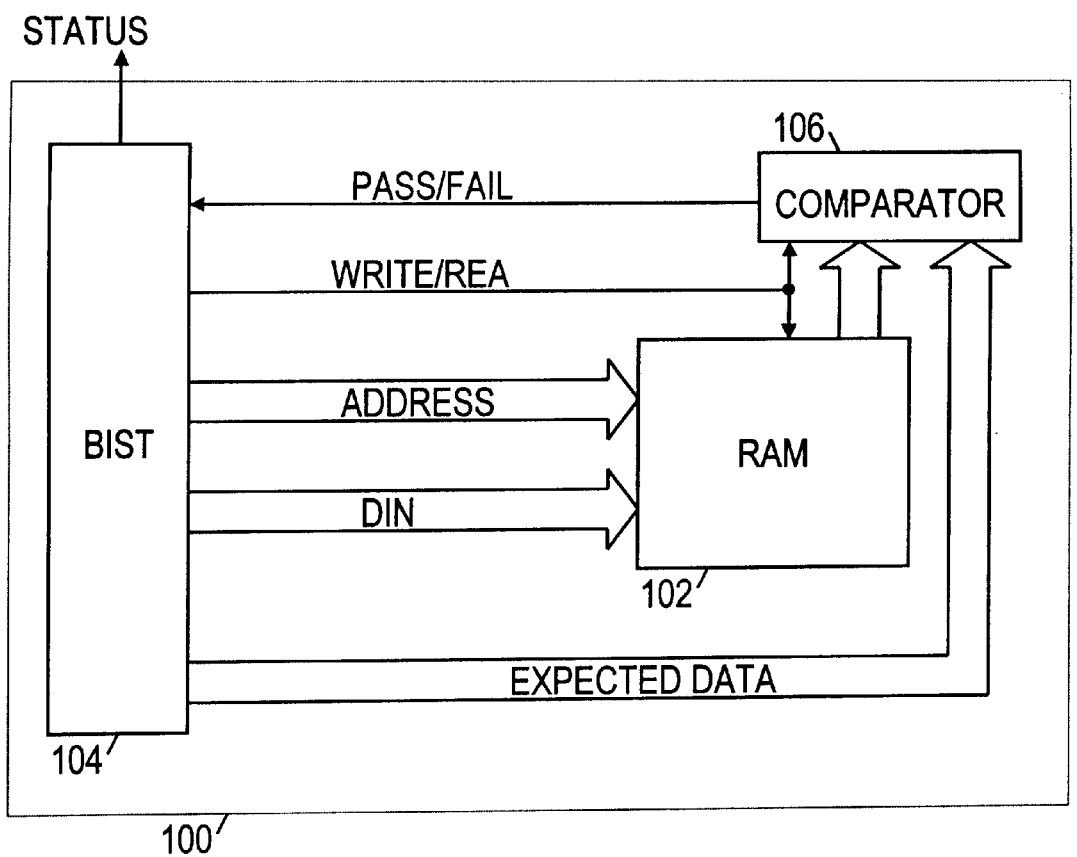
FIG. 1 is a functional block diagram of a conventional built-in self test configuration.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a functional block diagram of integrated circuit 100 with a conventional BIST configuration is shown. Integrated circuit 100 includes an embedded device 102, BIST circuitry 104, and comparator 106. It is noted that device 102 may be a memory, a multiplier, or some other digital circuit module. For the purposes of clarity, it will be assumed that embedded device 102 is a RAM. When power is first applied to integrated circuit 100, the circuit enters a self test mode. In the self test mode BIST 104 begins applying address and data signals to RAM 102 to test for faults. Data patterns are written to addresses specified by BIST 104 when BIST 104 asserts a write signal. At a subsequent time BIST 104 checks for faults in RAM 102 by once again providing address signals to RAM 102 while asserting a read signal and simultaneously providing expected data to comparator 106. In response to the read and address signals RAM 102 provides output data to comparator 106. Comparator 106 compares the output data from RAM 102 to the expected data from BIST 104. If the output data matches the expected data comparator 106 asserts a pass/fail signal. BIST 104 receives the pass/fail signal and logs the results of each comparison by comparator 106. Once BIST 104 has finished reading and writing the data patterns to RAM 102, it allows the integrated circuit 100 to exit the self test mode by asserting a status signal indicating that no faults were detected in RAM 102. In another embodiment, BIST 104 may toggle the status signal for every detected memory fault and provide a separate signal to indicate the completion of the self test. This may allow for some localization of the detected memory fault within the self test which could aid in determining the cause of the memory fault.

A standard BIST circuit contains hard wired modules for generating address, pattern, and expected data, as well as comparison and control logic. Because these modules are hard wired, is not possible to modify how the test is performed. BIST circuits are often used to test embedded memories, where it is not possible to gain direct access to the memory. Although the BIST is effective in testing the memory, it is not as useful in debugging memory because it is not possible to modify the test. Consequently although the BIST can tell you if a part has failed, it is still difficult to ascertain why. This is particularly important for new devices and technologies.

Figure 2:
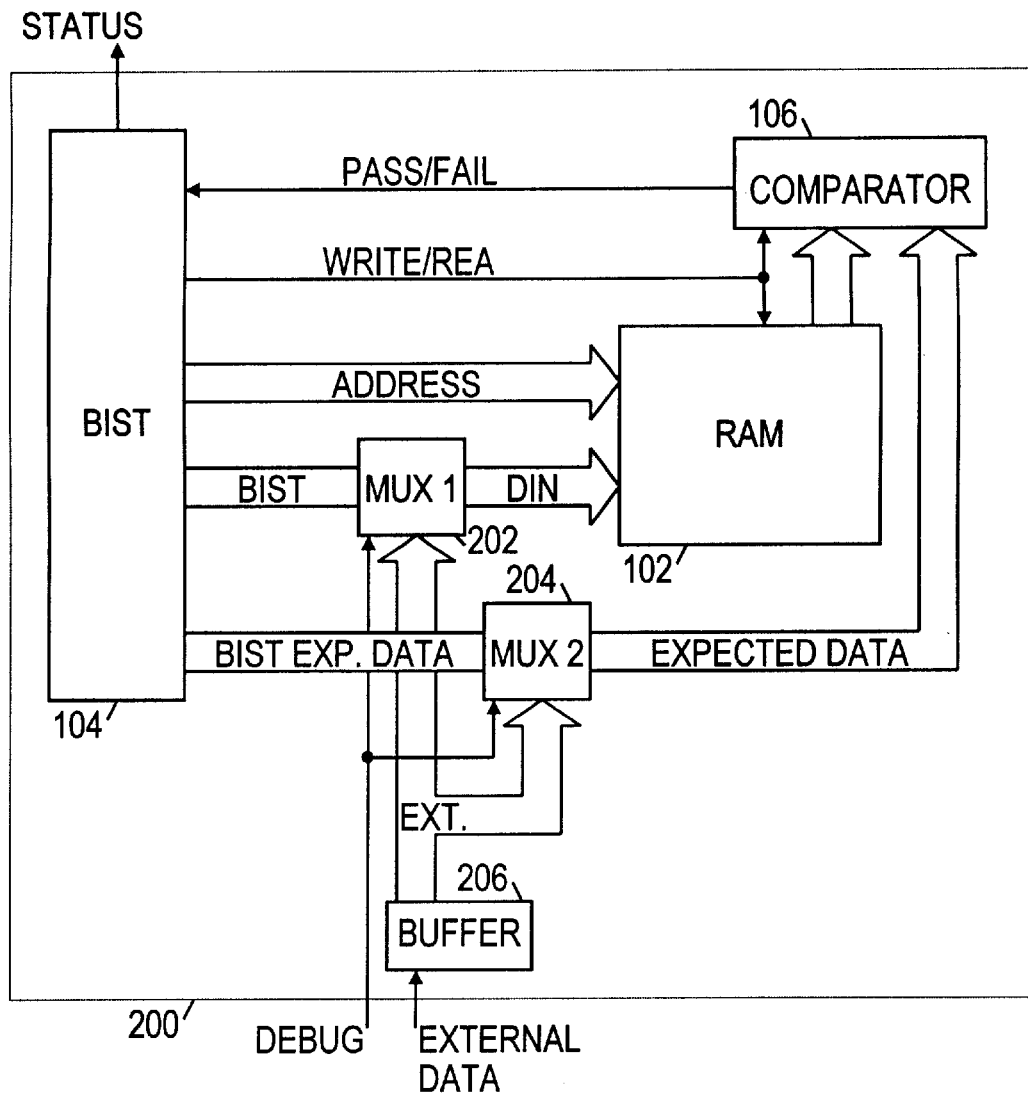
FIG. 2 is a functional block diagram of an improved built-in self test configuration .

Turning now to FIG. 2, a functional block diagram of integrated circuit 200 with an improved BIST configuration is shown. The improved BIST configuration includes multiplexers 202, 204 and a buffer 206. Multiplexers 202,204 are controlled by an external debug signal. When the debug signal is de-asserted, multiplexer 202 routes data patterns from BIST 104 to RAM 102, and multiplexer 204 routes expected data from BIST 104 to comparator 106. A when the debug signal is asserted, multiplexer 202 routes data patterns from external data buffer 206 to RAM 102, and multiplexer 204 routes expected data from external data buffer 206 to comparator 106.

In normal operation the debug signal is de-asserted, and there is no change in how the BIST operates from a conventional BIST. However, when a part requires debugging it is possible to modify the pattern data and expected data seen by RAM 102. This is accomplished by asserting the debug signal, which brings the data buses under external control. During a write cycle multiplexer 202 will select the external data bus as the data pattern provided to the RAM 102. Similarly, during a read cycle, multiplexer 204 will select the external data bus as the expected data for comparator 106. The external data bus instrument by buffer 206 which is driven by the user provided external data signal. In this manner the data written to RAM 102 can be controlled by the user. In one embodiment a single external pin may be used to drive all the lines of the external data bus, thereby reducing the external pin count.

It should be understood that BIST 104 still supplies the address and control signals to RAM 102, so a thorough understanding of the BIST algorithm is necessary to ensure proper application of the data patterns. Nevertheless this improved configuration allows the user to create new memory test programs simply by modifying the vectors used to clock the BIST. This advantageously provides increased control of the memory debugging process and allows greater diagnostability of failing parts. For example, if it is seen that a certain part of the BIST algorithm is failing, by modifying the data pattern it can be determined whether the problem is promised by the pattern or by the address sequence. If the failure moves to different part of the algorithm, or disappears entirely, and may be concluded that failure was due to the data pattern. On the other hand if the failure remains in the same place, it may be concluded that the failure was due to address sequence. This kind of basic debugging is not possible with a conventional BIST.

In one embodiment, a clock signal relied on by the BIST circuitry when the debug signal is asserted is provided from off-chip. By sourcing the clock signal from the source of the external data, synchronization may be guaranteed. In a second embodiment, the clock signal relied on by the BIST circuitry is routed off-chip when the debug signal is asserted. This clock signal may then be used by the external data source to achieve synchronization.

One example of an external data source is programmable test equipment. A user places an integrated circuit in a socket controlled by the programmable test equipment and runs a test program which asserts the debug signal and applies a sequence of external data signal values to the integrated circuit in synchronization with the clock signal used by the BIST circuitry. The test program also monitors the BIST status signal to determine the points in the test program at which memory faults are detected, and compiles an overall summary of the test results when the test program is completed. The user can then experiment by modifying the test program to determine various aspects of the detected memory faults, thereby compiling evidence as to the cause of the memory faults.

Numerous variations and modifications will become apparent to those skilled in the art once the above disclosure is fully appreciated. It is intended that the following claims be interpreted to embrace all such variations and modifications.

What is claimed is:

1. An integrated circuit which has a self start mode, wherein the integrated circuit comprises:
   an embedded memory configured to store input data in a location specified by an address signal when a write signal is asserted and further configured to provide output data from a location specified by the address signal when a read signal is asserted;

a built-in self test circuit coupled to provide the address signal, the write signal, and the read signal to the embedded memory during the self test mode, wherein the built-in self test circuit is configured to generate BIST data patterns and BIST expected data during the self test mode;

a comparator coupled to receive the output data from the embedded memory and configured to compare the output data to compare data, wherein the comparator is further coupled to provide comparison results to the built-in self test circuit;

a first multiplexer coupled to the built-in self test circuit to receive the BIST data patterns, coupled to the embedded memory to provide the input data, coupled to an external data buffer to receive external data, and configured to provide the BIST data patterns as the input data when a debug signal is de-asserted and to provide the external data as the input data when the debug signal is asserted; and a second multiplexer coupled to receive the BIST expected data from the built-in self test circuit, coupled to receive the external data from the external data buffer, and coupled to the comparator to provide the compare data, wherein the second multiplexer is configured to provide the BIST expected data as the compare data when the debug signal is de-asserted and to provide the external data as the compare data when the debug signal is asserted.

2. The integrated circuit of claim 1, wherein the external data buffer drives all bits of the external data in accordance with a voltage state of an external pin when the debug signal is asserted.

3. The integrated circuit of claim 1, wherein the built-in self test circuit compiles the comparison results and asserts a BIST status signal indicating successful completion of the self test mode if no memory faults are detected.

4. The integrated circuit of claim 1, wherein the built-in self test circuit toggles a BIST status signal for each comparison result which indicates a memory fault.

5. A method for debugging a faulty embedded memory, wherein the method comprises:

applying power to an integrated circuit which includes the embedded memory, thereby causing the integrated circuit to enter a self test mode in which a built-in self test circuit applies a sequence of read and write addresses to the embedded memory;

providing external data to a first multiplexer which is coupled to provide input data to the embedded memory and to a second multiplexer which is coupled to provide expected data to a comparator;

asserting a debug signal to cause the first multiplexer to forward the external data to the embedded memory and to cause the second multiplexer to forward the external data to the comparator wherein the comparator is configured to compare the expected data to output data from the embedded memory and to forward the comparison results to the built-in self test circuit; and monitoring a BIST status signal provided by the built-in self test circuit, wherein the BIST status signal is indicative of detected memory faults.

* * * * *